(12) United States Patent
Yang et al.

(10) Patent No.: US 9,593,418 B2
(45) Date of Patent: Mar. 14, 2017

(54) SHOWERHEAD HAVING COOLING SYSTEM AND SUBSTRATE PROCESSING APPARATUS INCLUDING THE SHOWERHEAD

(71) Applicant: EUGENE TECHNOLOGY CO., LTD., Gyeonggi-do (KR)

(72) Inventors: Il-Kwang Yang, Gyeonggi-do (KR); Byoung-Gyu Song, Gyeonggi-do (KR); Yong-Ki Kim, Chungcheongnam-do (KR); Kyong-Hun Kim, Gyeonggi-do (KR); Yang-Sik Shin, Gyeonggi-do (KR)

(73) Assignee: EUGENE TECHNOLOGY CO., LTD., Yongin-si, Gyeonggi-do (KR)

( * ) Notice: Subject to any disclaimer, the term of this patent is extended or adjusted under 35 U.S.C. 154(b) by 342 days.

(21) Appl. No.: 14/361,329

(22) PCT Filed: Nov. 23, 2012

(86) PCT No.: PCT/KR2012/009952
§ 371 (c)(1),
(2) Date: May 29, 2014

(87) PCT Pub. No.: WO2013/105730
PCT Pub. Date: Jul. 18, 2013

(65) Prior Publication Data
US 2014/0311411 A1 Oct. 23, 2014

(30) Foreign Application Priority Data
Jan. 10, 2012 (KR) .................. 10-2012-0003106

(51) Int. Cl.
*C23C 16/455* (2006.01)

(52) U.S. Cl.
CPC .. *C23C 16/45565* (2013.01); *C23C 16/45572* (2013.01)

(58) Field of Classification Search
CPC .................. C23C 16/45565; C23C 16/45572
(Continued)

(56) References Cited

U.S. PATENT DOCUMENTS 5,595,606 A * 1/1997 Fujikawa .......... C23C 16/45561
 118/715
5,653,806 A * 8/1997 Van Buskirk ....... C23C 16/4557
 118/666

(Continued)

FOREIGN PATENT DOCUMENTS

JP 07-058101 A 3/1995
KR 10-2007-0013100 A 1/2007

*Primary Examiner* — Jeffrie R Lund
(74) *Attorney, Agent, or Firm* — Rabin & Berdo, P.C.

(57) ABSTRACT

Provided is a substrate processing apparatus. The substrate processing apparatus includes a chamber body having an opened upper side, the chamber body providing an inner space in which processes with respect to a substrate are performed, a chamber lid disposed on an upper portion of the chamber body to close the opened upper side of the chamber body, and a showerhead disposed on a lower portion of the chamber lid to supply a reaction gas into the inner space. The showerhead includes a flange contacting the chamber lid, the flange having a passage recessed from a top surface of the flange to allow a refrigerant to flow therein, and a flat plate disposed inside the flange, the flat plate having at least one injection hole for injecting the reaction gas in a thickness direction thereof.

10 Claims, 4 Drawing Sheets

(58) Field of Classification Search
USPC .................................................. 118/715, 724
See application file for complete search history.

(56) References Cited

U.S. PATENT DOCUMENTS

| | | | | |
|---|---|---|---|---|
| 5,906,683 | A * | 5/1999 | Chen | C23C 16/455 118/715 |
| 5,968,276 | A * | 10/1999 | Lei | C23C 16/455 118/723 E |
| 6,019,848 | A * | 2/2000 | Frankel | C23C 16/4405 118/715 |
| 6,064,800 | A * | 5/2000 | Sandhu | C23C 16/45565 118/50.1 |
| 6,117,245 | A * | 9/2000 | Mandrekar | H01J 37/3244 118/724 |
| 6,352,591 | B1 * | 3/2002 | Yieh | C23C 16/0245 118/697 |
| 6,379,466 | B1 * | 4/2002 | Sahin | C23C 16/455 118/715 |
| 6,433,314 | B1 * | 8/2002 | Mandrekar | G05D 23/19 118/715 |
| 6,553,932 | B2 | 4/2003 | Liu et al. | |
| 8,142,521 | B2 * | 3/2012 | Wieting | C23C 16/45512 118/724 |
| 2002/0029748 | A1 * | 3/2002 | Kuwada | C23C 16/4405 118/724 |
| 2002/0092471 | A1 * | 7/2002 | Kang | C23C 16/455 118/715 |
| 2003/0047282 | A1 * | 3/2003 | Sago | C23C 16/45565 156/345.34 |
| 2003/0066606 | A1 * | 4/2003 | Clarke | C23C 14/564 156/345.32 |
| 2004/0118519 | A1 * | 6/2004 | Sen | C23C 16/4405 156/345.33 |
| 2004/0129224 | A1 * | 7/2004 | Yamazaki | C23C 16/4401 118/724 |
| 2007/0158026 | A1 * | 7/2007 | Amikura | C23C 16/455 156/345.34 |
| 2009/0095220 | A1 * | 4/2009 | Meinhold | C23C 16/45565 118/712 |
| 2009/0107403 | A1 * | 4/2009 | Moshtagh | C23C 16/4584 118/728 |
| 2009/0151639 | A1 * | 6/2009 | Kasai | C23C 16/14 118/724 |
| 2009/0250008 | A1 * | 10/2009 | Matsushima | C23C 16/401 118/728 |
| 2010/0003405 | A1 * | 1/2010 | Kappeler | C23C 16/45551 427/255.28 |
| 2010/0099263 | A1 * | 4/2010 | Kao | H01J 37/32357 438/703 |
| 2010/0151131 | A1 * | 6/2010 | Obara | C23C 16/4412 427/255.28 |
| 2010/0294199 | A1 * | 11/2010 | Tran | C23C 16/4401 118/723 R |
| 2011/0048325 | A1 * | 3/2011 | Choi | C23C 16/452 118/712 |
| 2011/0256692 | A1 * | 10/2011 | Tam | C23C 16/45519 438/478 |
| 2012/0064698 | A1 * | 3/2012 | Olgado | C23C 16/45565 438/478 |
| 2012/0193456 | A1 * | 8/2012 | Lubomirsky | C23C 16/45563 239/548 |
| 2013/0118405 | A1 * | 5/2013 | Ho | C23C 16/4409 118/715 |
| 2013/0316094 | A1 * | 11/2013 | Leeser | C23C 16/455 427/569 |
| 2014/0159325 | A1 * | 6/2014 | Parkhe | H01L 21/67109 279/128 |
| 2014/0235069 | A1 * | 8/2014 | Breiling | F28F 3/02 438/778 |
| 2014/0262038 | A1 * | 9/2014 | Wang | H01L 21/6708 156/345.35 |
| 2014/0263275 | A1 * | 9/2014 | Nguyen | H01L 21/67109 219/446.1 |
| 2014/0311411 | A1 * | 10/2014 | Yang | C23C 16/45572 118/733 |

* cited by examiner

SHOWERHEAD HAVING COOLING SYSTEM AND SUBSTRATE PROCESSING APPARATUS INCLUDING THE SHOWERHEAD

BACKGROUND OF THE INVENTION

The present invention disclosed herein relates to a showerhead and a substrate processing apparatus including the same, and more particularly, to a showerhead having a cooling system and a substrate processing apparatus including the same.

A semiconductor device includes a plurality of layers on a silicon substrate. The layers are deposited on the substrate through a deposition process. A chemical vapor deposition process represents a process in which a gaseous compound (or a reaction gas) is dissolved to form a thin film or an epitaxial layer on a semiconductor substrate through chemical reaction.

A support is disposed within a process chamber, and a substrate is placed on the support. A deposition process is performed within the process chamber. Before the deposition process is performed, the inside of the process chamber is heated to a high temperature (e.g., about 650° C. or more). A showerhead is disposed above the substrate to supply the gaseous compound (or the reaction gas) onto the substrate. The gaseous compound is absorbed on a surface of the substrate to chemically react with each other on the surface of the substrate, thereby forming a thin film.

The showerhead is disposed within the process chamber. Also, the showerhead is under a high temperature while the processes are performed. Thus, the showerhead may be heated and thermally deformed. The thermal deformation of the showerhead has an influence on the uniform supply of the reaction gas. If the reaction gas is not uniformly supplied onto the substrate, the thin film may have a non-uniform thickness along the surface of the substrate.

Also, if the showerhead is heated at a temperature greater than a predetermined temperature, the reaction gas may be deposited within the showerhead or may form particles.

SUMMARY OF THE INVENTION

The present invention provides a showerhead having a cooling system for preventing the showerhead from being thermally deformed and a substrate processing apparatus including the showerhead.

The present invention also provides a showerhead having a cooling system which prevents a refrigerant from having a bad influence on processes due to leakage of the refrigerant and a substrate processing apparatus including the showerhead.

The present invention also provides a showerhead having a cooling system which quickly cools the showerhead and a substrate processing apparatus including the showerhead.

Further another object of the present invention will become evident with reference to following detailed descriptions and accompanying drawings.

Embodiments of the present invention provide substrate processing apparatuses including: a chamber body having an opened upper side, the chamber body providing an inner space in which processes with respect to a substrate are performed; a chamber lid disposed on an upper portion of the chamber body to close the opened upper side of the chamber body; and a showerhead disposed on a lower portion of the chamber lid to supply a reaction gas into the inner space, wherein the showerhead includes: a flange contacting the chamber lid, the flange having a passage recessed from a top surface of the flange to allow a refrigerant to flow therein; and a flat plate disposed inside the flange, the flat plate having at least one injection hole for injecting the reaction gas in a thickness direction thereof.

In some embodiments, the substrate processing apparatuses may further include a sealing member disposed between the chamber lid and the flange and inside the passage.

In other embodiments, the showerhead may further include a passage cover coupled to the flange to close an upper portion of the passage.

In still other embodiments, the passage may be disposed inside the chamber body to correspond to the inner space.

In even other embodiments, the flat plate may be spaced from a lower surface of the chamber lid to define a buffer space between the chamber lid and the flat plate.

In yet other embodiments, the chamber lid may further include a gas supply port communicating with the buffer space to receive the reaction gas from the outside, and the substrate processing apparatuses may further comprise a block plate have a plurality of diffusion holes and be fixed to the lower portion of the chamber lid to be disposed in the buffer space.

In further embodiments, the passage cover may be welded to the flange.

In still further embodiments, the passage may include a circulation passage defined along a circumference of the injection hole and inflow and discharge passages respectively connected to both ends of the circulation passage.

In even further embodiments, the flange may have a circular ring shape, and the flange may have a thickness greater than that of the flat plate.

In yet further embodiments, the flange may have a square ring shape, and the flange may have a thickness greater than that of the flat plate.

In other embodiments of the present invention, showerheads include: a flange having a passage recessed from a top surface of the flange to allow a refrigerant to flow therein; and a flat plate disposed inside the flange, the flat plate having at least one injection hole for injecting a reaction gas in a thickness direction thereof.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
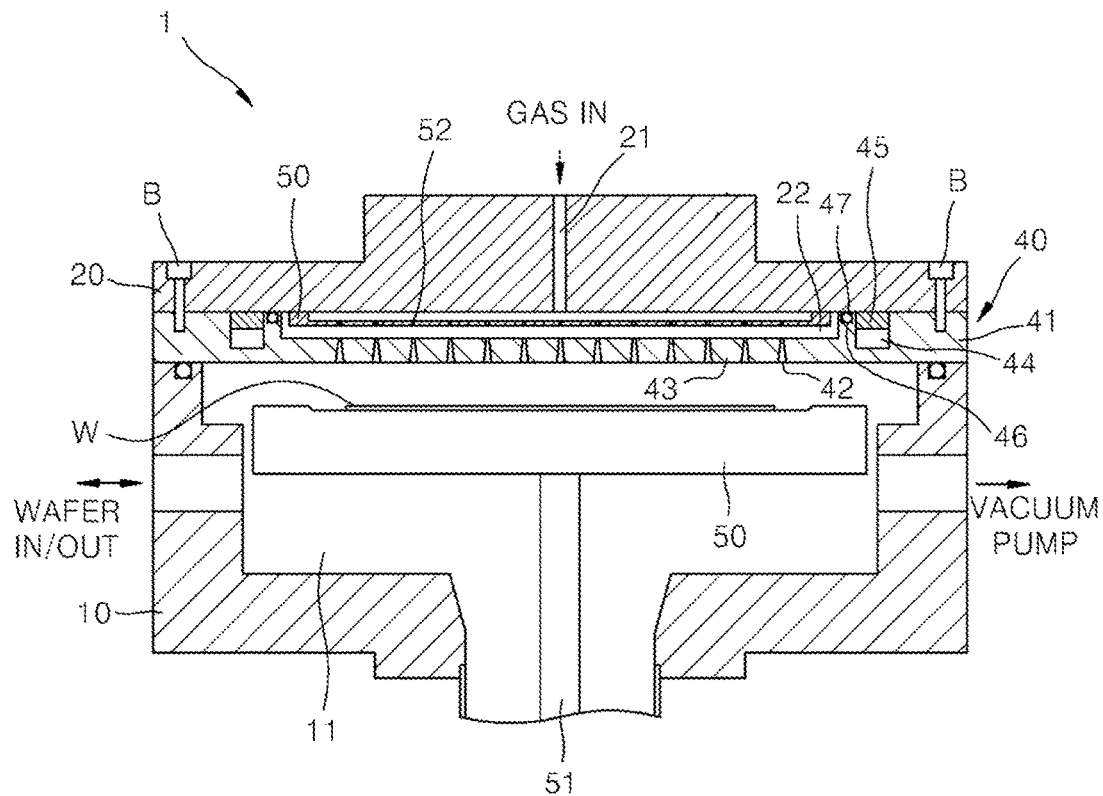
FIG. 1 is a view of a substrate processing apparatus according to an embodiment of the present invention.

Hereinafter, exemplary embodiments of the present invention will be described in detail with reference to FIGS.

1 to 6. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the drawings, the shapes of components are exaggerated for clarity of illustration.

Although a deposition process is described below as an example, the present invention may be applied to various semiconductor manufacturing processes including the deposition process.

FIG. 1 is a view of a substrate processing apparatus according to an embodiment of the present invention. Referring to FIG. 1, a substrate processing apparatus 1 includes a chamber body 10 and a chamber lid 20. The chamber body 10 has an opened upper side. The chamber lid 20 opens or closes the opened upper side of the chamber body 10. When the chamber lid 20 closes the opened upper side of the chamber body 10, the chamber body 10 and the chamber lid 20 define an inner space closed against the outside.

The chamber body 10 has a chamber interior 11 corresponding to the inner space. A wafer W is loaded into the chamber interior 11 through a passage defined in a side of the chamber body 10. A support plate 50 is disposed in the chamber interior 11. The loaded wafer W is placed on a top surface of the support plate 50. A support 51 is connected to a lower portion of the support plate 50 to support the support plate 50.

A gas supply port 21 is disposed within the chamber lid 20. A reaction gas is introduced into the chamber interior 11 through the gas supply port 21. The reaction gas is used for depositing a thin film on a surface of the wafer W. Here, various gases may be used according to a kind of thin film.

A showerhead 40 is connected to a lower portion of the chamber lid 20. Both sides of the showerhead 40 are coupled to the chamber lid 20 through bolts B. The showerhead 40 supplies the reaction gas supplied through the gas supply port 21 into the chamber interior 11. The reaction gas is moved onto the surface of the wafer W to form a thin film on the surface of the wafer W.

Figure 2:
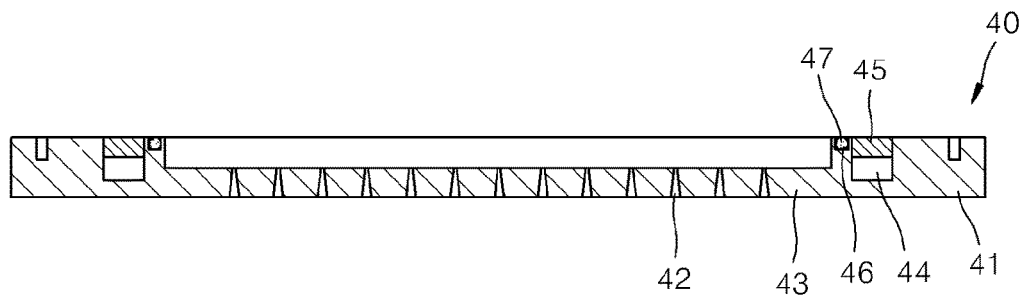
FIGS. 2 and 3 are views illustrating a showerhead of FIG. 1.
Figure 3:
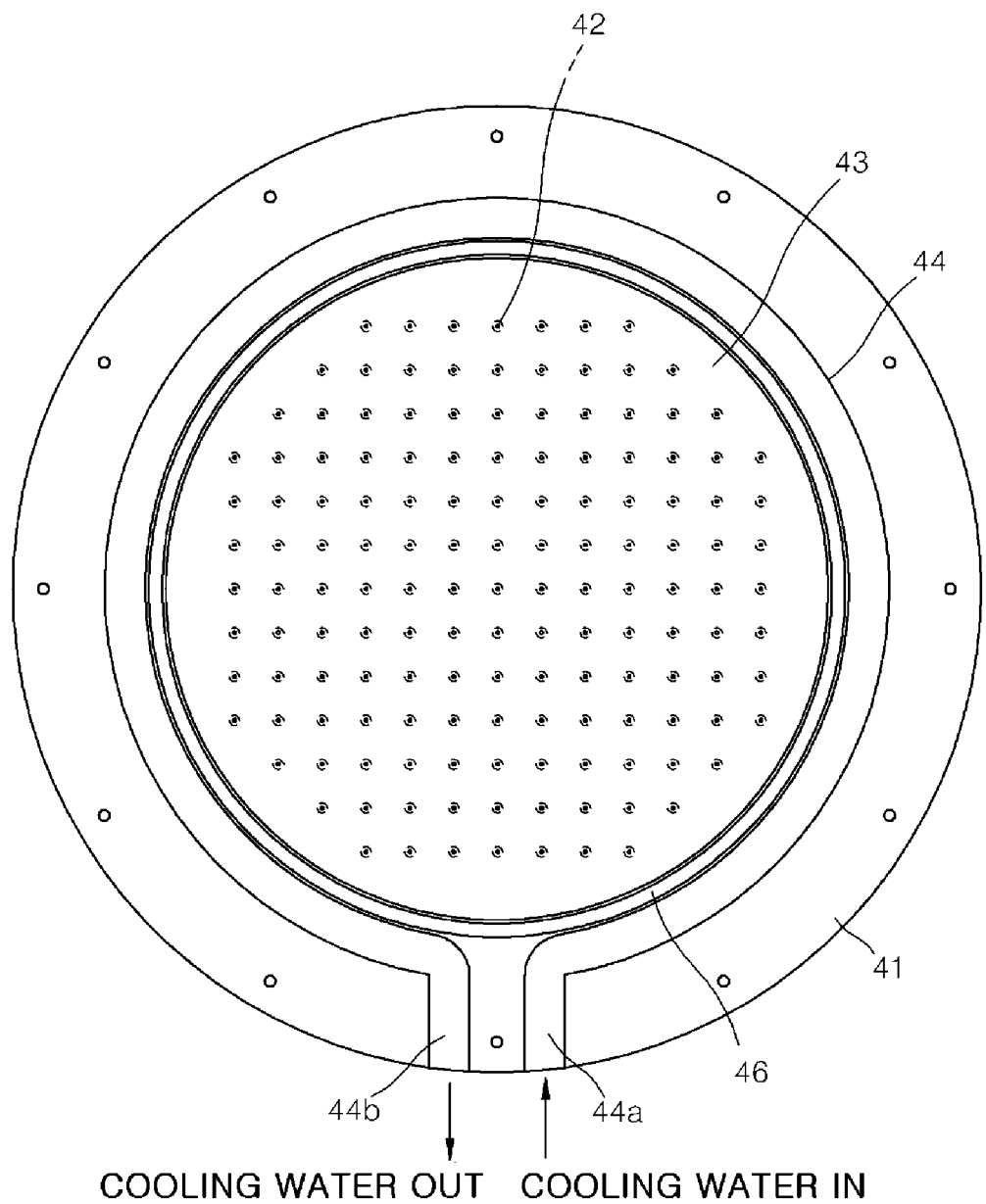

FIGS. 2 and 3 are views illustrating the showerhead of FIG. 1. Referring to FIGS. 2 and 3, the showerhead 40 includes a flange 41 and a flat plate 43. Referring to FIG. 3, the flat plate 43 has a disk shape corresponding to that of the wafer W. The flange 41 has a ring shape disposed along an outer circumference of the flat plate 43. The flat plate 43 is disposed to correspond to the wafer W placed on the support plate 50. Also, the flat plate 43 has a plurality of injection holes 42 defined in a thickness direction thereof. The reaction gas is moved toward an upper portion of the flat plate 43 through the gas supply port 21 and diffused onto the surface of the wafer W through the injection holes 42.

As shown in FIG. 1, the flange 41 is coupled to the chamber lid 20 through the bolts B. The flat plate 43 is connected to the flange 41 and disposed under the chamber lid 20. Here, a bottom surface of the flat plate 43 is disposed parallel to a bottom surface of the flange 41. Since the flange 41 has a thickness greater than that of the flat plate 43, the flat plate 43 is spaced apart from a bottom surface of the chamber lid 20. Thus, a top surface of the flat plate 43 is spaced apart from the bottom surface of the chamber lid 20. As a result, a buffer space 22 is defined between the flat plate 43 and the chamber lid 20.

A block plate 53 is disposed in the buffer space 22. Both sides of the block plate 53 are fixed to the chamber lid 20. The block plate 50 has a plurality of diffusion holes 52. The reaction gas is moved into the block plate 50 through the gas supply port 21 and diffused through the diffusion holes 52. Then, the reaction gas is moved onto the upper portion of the flat plate 43. Here, the diffusion holes 52 may be defined to correspond to the injection holes 42 defined in the flat plate 43.

As shown in FIGS. 1 and 2, the flange 41 has a circulation passage 44. The circulation passage 44 is disposed to corresponding to the chamber interior 11. A top surface of the flange 41 is recessed to define the circulation passage 44. As shown in FIG. 3, the circulation passage 44 is defined along the outer circumference of the flat plate 43. Also, an inflow passage 44a and a discharge passage 44b are connected to both ends of the circulation passage 44. Like the circulation passage 44, the top surface of the flange 41 is recessed to define the inflow passage 44a and the discharge passage 44b.

Refrigerant (e.g., water) is introduced into the circulation passage 44 through the inflow passage 44a. The refrigerant circulating into the circulation passage 44 is discharged through the discharge passage 44b. The refrigerant cools the showerhead 40 to a temperature less than a preset temperature while circulating into the circulation passage 44. The discharge refrigerant is cooled by an external chiller. Thus, it may prevent the showerhead 40 from being overheated. Also, the showerhead 40 may be controlled to have a temperature less than the preset temperature. The injection holes 42 are defined inside the circulation passage 44.

A passage cover 45 may be coupled (e.g., welded) to the flange 41 to close or seal an opened upper side of the circulation passage 44 (and the inflow and discharge passages 44a and 44b), thereby preventing the refrigerant flowing through the circulation passage 44 from leaking to the outside. The passage cover 45 has a shape corresponding to those of the circulation passage 44, the inflow passage 44a, and the discharge passage 44b.

As described above, the top surface of the flange 41 is recessed to define the circulation passage 44. In this structure, the refrigerant circulating along the circulation passage 44 may leak into the chamber interior 11 through a lower portion of the circulation passage 44. That is, since the flange 41 is integrally manufactured, and the circulation passage 44 is defined by recessing the top surface of the flange 41, the refrigerant may leak through the upper portion of the circulation passage 44, but not leak through the lower portion of the circulation passage 44. The opened upper side of the circulation passage 44 is sealed by the passage cover 45.

The flange 41 has a fixing groove 46. The top surface of the flange 41 is recessed to define the fixing groove 46. The fixing groove 46 is defined inside the circulation passage 44. A sealing member 47 is inserted into the fixing groove 46.

As described above, since the refrigerant circulating along the circulation passage 44 may leak through the upper portion of the circulation passage 44, even though the upper portion of the circulation passage 44 is sealed by the passage cover 45, the refrigerant may leak as ever due to incomplete sealing of the passage cover 45. If the refrigerant leaking through the upper portion of the circulation passage 44 flows into the showerhead 40 and is moved toward the upper portion (or the buffer space 22) of the flat plate 43, the refrigerant may be moved together with the reaction gas into the chamber interior 11 (or an upper portion of the wafer W) to have a bad influence on the process. As a result, process failure may occur. Thus, even though the refrigerant leaks, it may prevent the leaking refrigerant from having a bad influence on the process. As a result, process losses may be minimized.

The sealing member 47 is disposed on the fixing groove 46 to seal a space between the flange 41 and the chamber lid 20. Thus, it may prevent the refrigerant from flowing into the showerhead 40. Thus, the refrigerant may flow outside the showerhead 40 and be discharged to the outside of the substrate processing apparatus 1. That is, the sealing member 47 prevents the refrigerant from being introduced into the chamber interior 11 through the buffer space 22. Thus, it may prevent process failure from occurring due to the leakage of the refrigerant.

In conclusion, since the showerhead 40 has a structure in which the circulation passage 44, the inflow passage 44a, and the discharge passage 44b are recessed from the top surface of the flange 41, it may prevent the refrigerant from leaking into the chamber interior 11 through the circulation passage 44, the inflow passage 44a, and the discharge passage 44b. Also, when the refrigerant leaks through the upper portion of the circulation passage 44, the refrigerant does not flow into the showerhead 40 due to the sealing member 47. Thus, the refrigerant flows outside the showerhead 40 and then is discharged outside the substrate processing apparatus 1.

The flange 41 is cooled by the refrigerant, and heat of the flat plate 43 is transferred into the flange 41. Here, the heat transfer within the flat plate 43 may be performed in thickness and length directions thereof. Thus, the more the flat plate 43 is increased in thickness, the more a heat transfer rate toward the flange 41 (in the length direction of the flat plate 43) is slow. That is, the heat transfer rate toward the flange 41 is inversely proportional to a thickness of the flat plate 43. If the flat plate 43 has a less thickness, the heat transfer within the flat plate 43 may be mainly concentrated in a direction of the flange 41 (or the length direction). Thus, the flat plate 43 may be quickly cooled.

Also, heat capacity is proportional to a mass. Thus, when the flange 41 has a thick thickness, the flange 41 may have sufficient heat capacity to sufficiently absorb heat of the flat plate 43. In cases like above, the flange 41 may have a thickness greater than that of the flat plate 43.

Figure 4:
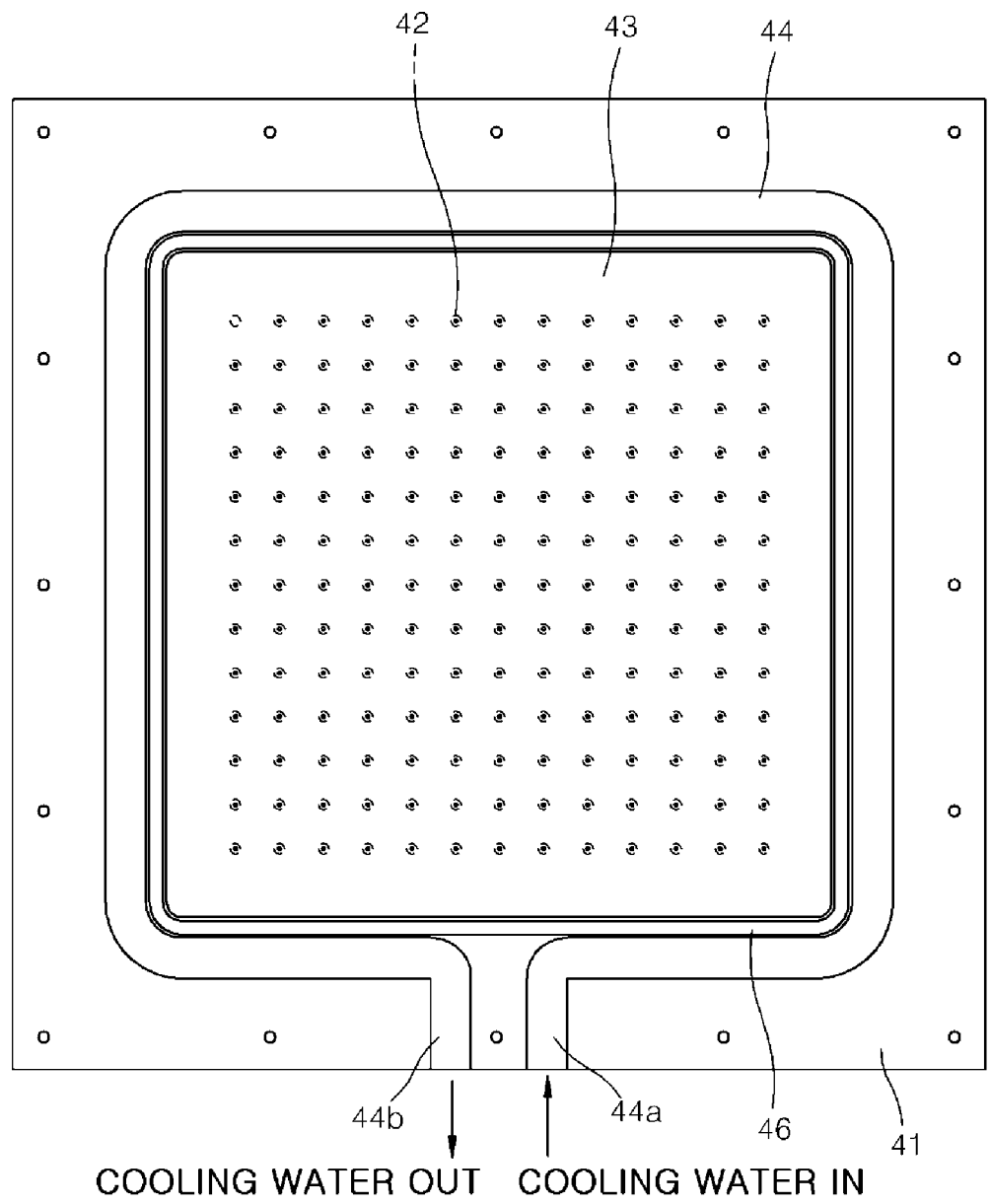
FIG. 4 is a view illustrating a modified example of the showerhead of FIG. 1.

FIG. 4 is a view illustrating a modified example of the showerhead of FIG. 1. The showerhead 40 of FIG. 3 may perform processes with respect to a circular wafer W. The showerhead 40 of FIG. 4 may perform processes with respect to a square substrate. The square substrate is used in processes for manufacturing flat panel displays (e.g., liquid crystal panels).

Figure 5:
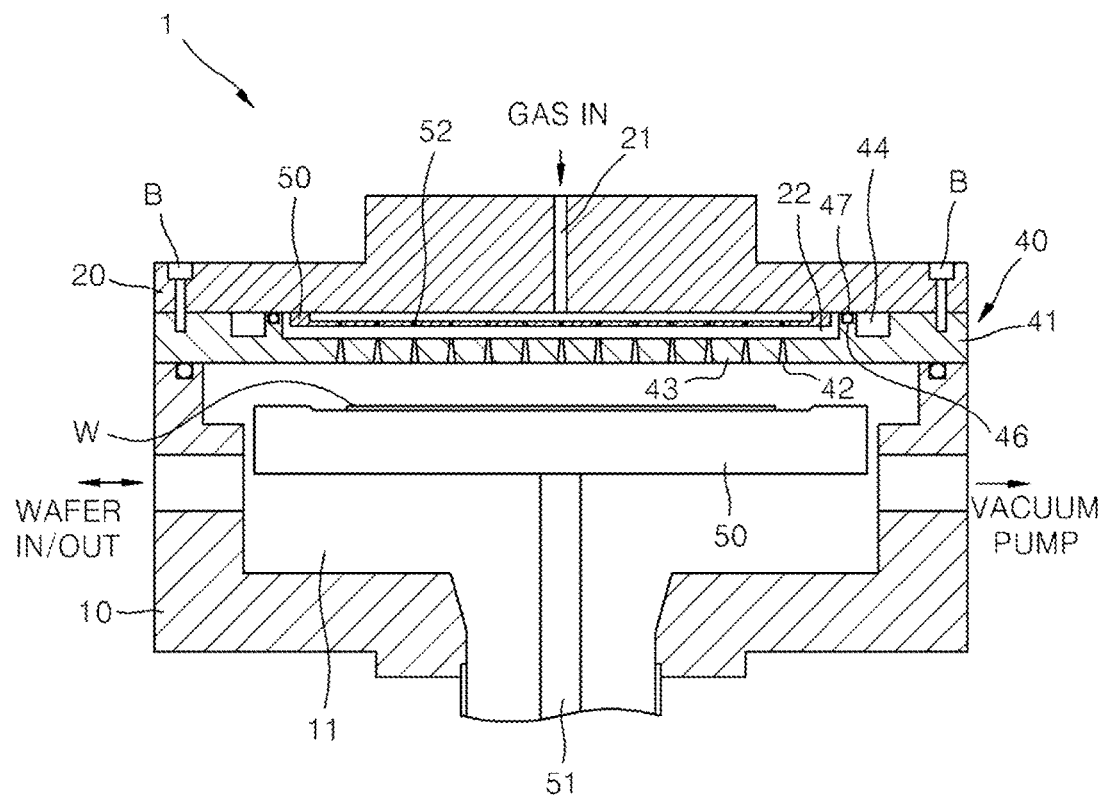
FIG. 5 is a view of a substrate processing apparatus according to another embodiment of the present invention.
Figure 6:
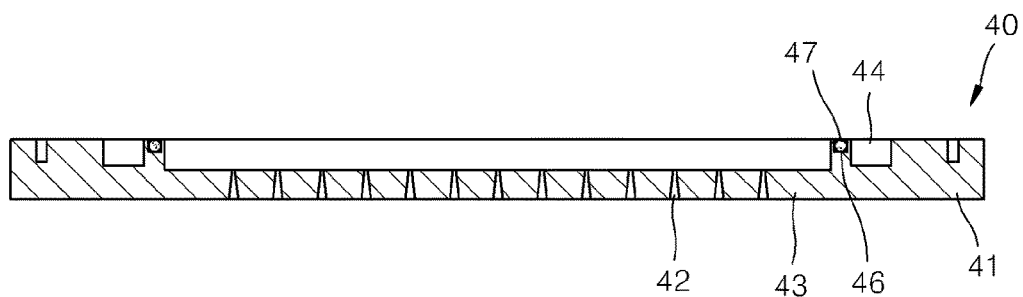
FIG. 6 is a view illustrating a showerhead of FIG. 5.

FIG. 5 is a view of a substrate processing apparatus according to another embodiment of the present invention. FIG. 6 is a view illustrating a showerhead of FIG. 5. Referring to FIGS. 1 and 2, the passage cover 45 closes and seals the opened upper side of the circulation passage 44 (and the inflow and discharge passages 44a and 44b). However, referring to FIGS. 5 and 6, the passage cover may be omitted. Thus, the opened upper side of the circulation passage 44 (and the inflow and discharge passages 44a and 44b) may be closed and sealed by the chamber lid 20. Although refrigerant may leak through the upper portion of the circulation passage 44 due to incomplete closing and sealing of the chamber lid 20, the sealing member 47 may prevent the refrigerant from flowing into the showerhead 40. Thus, the process failure due to the leakage of the refrigerant may be sufficiently prevented.

According to the embodiments, the showerhead may be cooled to prevent the showerhead from being thermally deformed. Also, when the refrigerant leaks from the showerhead, it may prevent the refrigerant from having a bad influence on the processes due to the leakage into the chamber interior. Also, the showerhead may be quickly cooled through a thickness difference thereof.

Although the present invention is described in detail with reference to the exemplary embodiments, the invention may be embodied in many different forms. Thus, technical idea and scope of claims set forth below are not limited to the preferred embodiments.

What is claimed is:

1. A substrate processing apparatus comprising:
   a chamber body having an opened upper side, the chamber body providing an inner space in which processes with respect to a substrate are performed;
   a showerhead disposed on an upper portion of the chamber body to close the opened upper side of the chamber body, wherein the showerhead supplies a reaction gas into the inner space; and
   a chamber lid disposed on an upper portion of the showerhead,
   wherein the showerhead comprises:
   a ring-shaped flange contacting a lower surface of the chamber lid and a top surface of the chamber body, the flange having a passage recessed from a top surface of the flange to allow a refrigerant to flow therein;
   a flat plate disposed inside the flange and spaced from the lower surface of the chamber lid, the flat plate having at least one injection hole for injecting the reaction gas in a thickness direction thereof; and
   a sealing member disposed between the chamber lid and the flange, wherein the sealing member is disposed radially inward of the passage.

2. The substrate processing apparatus of claim 1, wherein the showerhead further comprises a passage cover coupled to the flange to close an upper portion of the passage.

3. The substrate processing apparatus of claim 2, wherein the passage cover is welded to the flange.

4. The substrate processing apparatus of claim 1, wherein the passage is disposed inside the chamber body to correspond to the inner space.

5. The substrate processing apparatus of claim 1, wherein a buffer space is defined between the chamber lid and the flat plate.

6. The substrate processing apparatus of claim 5, wherein the chamber lid further comprises a gas supply port communicating with the buffer space to receive the reaction gas from the outside, and the substrate processing apparatus further comprising a block plate having a plurality of diffusion holes and being fixed to the lower portion of the chamber lid to be disposed in the buffer space.

7. The substrate processing apparatus of claim 1, wherein the passage comprises a circulation passage defined along a circumference of the injection hole and inflow and discharge passages respectively connected to both ends of the circulation passage.

8. The substrate processing apparatus of claim 1, wherein the flange has a circular ring shape, and
   the flange has a thickness greater than that of the flat plate.

9. The substrate processing apparatus of claim 1, wherein the flange has a square ring shape, and
   the flange has a thickness greater than that of the flat plate.

10. The substrate processing apparatus of claim 1, wherein:
    the flange, taken from a plan view, includes an inner region surrounded by an inner sidewall of the passage;

the flange includes a fixing groove recessed from the top surface of the flange in the inner region; and the sealing member is disposed on the fixing groove, the sealing member being located to be closer to the center of the showerhead than the inner sidewall of the passage is to the center of the showerhead.

\* \* \* \* \*